United States Patent
Chang Chien et al.

(10) Patent No.: US 10,510,655 B2
(45) Date of Patent: Dec. 17, 2019

(54) SEMICONDUCTOR DEVICES EMPLOYING A BARRIER LAYER

(71) Applicant: Taiwan Semiconductor Manufacturing Company, Ltd., Hsin-Chu (TW)

(72) Inventors: Ying-Hsueh Chang Chien, Hsin-chu (TW); Yu-Ming Lee, New Taipei (TW); Man-Kit Leung, Taipei (TW); Chi-Ming Yang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 60 days.

(21) Appl. No.: 14/490,216

(22) Filed: Sep. 18, 2014

(65) Prior Publication Data

US 2015/0001723 A1    Jan. 1, 2015

Related U.S. Application Data

(62) Division of application No. 13/734,892, filed on Jan. 4, 2013.

(51) Int. Cl.
*H01L 23/48* (2006.01)
*H01L 23/52* (2006.01)
*H01L 29/40* (2006.01)
*H01L 23/522* (2006.01)
*H01L 21/768* (2006.01)
*H01L 23/532* (2006.01)

(52) U.S. Cl.
CPC .... *H01L 23/5226* (2013.01); *H01L 21/76814* (2013.01); *H01L 21/76826* (2013.01); *H01L 21/76841* (2013.01); *H01L 21/76844* (2013.01); *H01L 21/76867* (2013.01); *H01L 23/5329* (2013.01); *H01L 23/53233* (2013.01); *H01L 23/53238* (2013.01); *H01L 23/53295* (2013.01); *H01L 2924/0002* (2013.01); *Y02P 80/30* (2015.11)

(58) Field of Classification Search
CPC ......... H01L 21/76841; H01L 21/76853; H01L 21/76855
See application file for complete search history.

(56) References Cited

U.S. PATENT DOCUMENTS 5,723,909 A * 3/1998 Yano ................. H01L 21/76801
257/637
6,028,015 A * 2/2000 Wang ................. H01L 21/3105
257/607
6,040,243 A * 3/2000 Li ..................... H01L 21/76805
257/E21.579

(Continued)

OTHER PUBLICATIONS

Lu, X. et al., "Low-temperature rapid synthesis of high-quality pristine or boron-doped graphene via Wurtz-type reductive coupling reaction," Journal of Materials Chemistry, 2011, DOI: 10.1039/c1jm11184a; www.rsc.org/materials, 5 pages.

*Primary Examiner* — Walter H Swanson
(74) *Attorney, Agent, or Firm* — Slater Matsil, LLP

(57) ABSTRACT

A semiconductor device includes providing a workpiece including an insulating material layer disposed thereon. The insulating material layer includes a trench formed therein. A barrier layer on the sidewalls of the trench is formed using a surface modification process and a surface treatment process.

20 Claims, 4 Drawing Sheets

(56) References Cited

U.S. PATENT DOCUMENTS

| | | | | |
|---|---|---|---|---|
| 6,054,398 A * | 4/2000 | Pramanick | H01L 21/76801 | 257/E21.576 |
| 6,090,699 A * | 7/2000 | Aoyama | H01L 21/76801 | 257/E21.507 |
| 6,255,732 B1 * | 7/2001 | Yokoyama | H01L 21/76885 | 257/760 |
| 6,265,779 B1 * | 7/2001 | Grill | H01L 21/3127 | 257/759 |
| 6,284,644 B1 * | 9/2001 | Aug | G01V 3/15 | 257/E21.576 |
| 6,284,657 B1 * | 9/2001 | Chooi | H01L 21/76801 | 257/E21.576 |
| 6,329,290 B1 * | 12/2001 | Zhao | H01L 21/76808 | 257/E21.579 |
| 6,417,112 B1 * | 7/2002 | Peyne | C09K 13/00 | 134/1 |
| 6,429,122 B2 * | 8/2002 | Chooi | H01L 21/76801 | 257/E21.576 |
| 6,429,129 B1 * | 8/2002 | Han | H01L 21/314 | 257/E21.264 |
| 6,429,519 B1 * | 8/2002 | Uzoh | H01L 21/76844 | 257/758 |
| 6,448,655 B1 * | 9/2002 | Babich | H01L 21/0212 | 257/759 |
| 6,479,408 B2 * | 11/2002 | Shioya | C23C 16/30 | 257/E21.261 |
| 6,518,166 B1 * | 2/2003 | Chen | H01L 21/76808 | 257/E21.271 |
| 6,528,409 B1 * | 3/2003 | Lopatin | H01L 21/288 | 257/E21.174 |
| 6,528,432 B1 * | 3/2003 | Ngo | H01L 21/31058 | 257/E21.242 |
| 6,537,896 B1 * | 3/2003 | Catabay | H01L 21/02107 | 257/E21.273 |
| 6,566,283 B1 * | 5/2003 | Pangrle | H01L 21/31058 | 257/E21.242 |
| 6,586,334 B2 * | 7/2003 | Jiang | H01L 21/76807 | 257/E21.579 |
| 6,605,549 B2 * | 8/2003 | Leu | C23C 16/02 | 257/E21.295 |
| 6,632,746 B2 * | 10/2003 | Kanegae | H01L 21/31053 | 257/E21.252 |
| 6,642,145 B1 * | 11/2003 | Avanzino | H01L 21/76814 | 257/E21.579 |
| 6,677,251 B1 * | 1/2004 | Lu | H01L 21/76801 | 257/E21.576 |
| 6,713,382 B1 * | 3/2004 | Pangrle | H01L 21/76802 | 257/E21.577 |
| 6,723,634 B1 * | 4/2004 | Ngo | H01L 21/76807 | 257/E21.577 |
| 6,723,635 B1 * | 4/2004 | Ngo | H01L 21/76807 | 257/E21.579 |
| 6,723,653 B1 * | 4/2004 | Kim | H01L 21/02063 | 257/E21.252 |
| 6,746,957 B2 * | 6/2004 | Ohtsuka | H01L 21/28556 | 257/E21.17 |
| 6,787,453 B2 * | 9/2004 | Abell | H01L 21/7682 | 257/E21.577 |
| 6,815,329 B2 * | 11/2004 | Babich | H01L 21/7681 | 257/E21.579 |
| 6,836,017 B2 * | 12/2004 | Ngo | H01L 21/76831 | 257/751 |
| 6,838,300 B2 * | 1/2005 | Jin | H01L 21/02126 | 257/E21.035 |
| 6,903,027 B2 * | 6/2005 | Matsuura | H01L 21/02137 | 257/E21.256 |
| 6,911,405 B2 * | 6/2005 | Shioya | H01L 21/3105 | 257/E21.241 |
| 6,919,636 B1 * | 7/2005 | Ryan | H01L 21/76807 | 257/751 |
| 6,972,253 B2 * | 12/2005 | Liu | H01L 21/76801 | 257/E21.576 |
| 6,995,073 B2 * | 2/2006 | Liou | H01L 21/76807 | 257/522 |
| 7,005,390 B2 * | 2/2006 | RamachandraRao | H01L 21/76808 | 257/783 |
| 7,015,150 B2 * | 3/2006 | Cooney, III | H01L 21/02107 | 257/E21.241 |
| 7,091,618 B2 * | 8/2006 | Yoshizawa | H01L 21/76808 | 257/774 |
| 7,132,363 B2 * | 11/2006 | Yang | H01L 21/76802 | 438/639 |
| 7,157,373 B2 * | 1/2007 | Knorr | H01L 21/76802 | 257/E21.577 |
| 7,179,751 B2 * | 2/2007 | Smith | G03F 7/427 | 257/E21.228 |
| 7,220,671 B2 * | 5/2007 | Simka | C23C 16/18 | 257/17 |
| 7,229,915 B2 * | 6/2007 | Soda | H01L 21/31116 | 257/E21.252 |
| 7,259,091 B2 | 8/2007 | Schuehrer et al. | | |
| 7,268,434 B2 * | 9/2007 | Nakashima | H01L 21/76808 | 257/773 |
| 7,271,089 B2 * | 9/2007 | Sandu | H01L 21/76802 | 257/E21.577 |
| 7,276,796 B1 * | 10/2007 | Yang | H01L 21/76805 | 257/486 |
| 7,309,658 B2 * | 12/2007 | Lazovsky | B82Y 30/00 | 257/E21.251 |
| 7,329,956 B1 * | 2/2008 | Yu | H01L 21/76814 | 257/639 |
| 7,368,393 B2 * | 5/2008 | America | H01L 21/02063 | 216/37 |
| 7,396,759 B1 | 7/2008 | van Schravendijk et al. | | |
| 7,498,242 B2 * | 3/2009 | Kumar | C23C 14/02 | 257/762 |
| 7,528,066 B2 * | 5/2009 | Yang | H01L 21/02063 | 438/618 |
| 7,538,028 B2 * | 5/2009 | Sandu | H01L 21/76802 | 257/E21.058 |
| 7,538,038 B2 * | 5/2009 | Matsushita | G03F 7/427 | 438/706 |
| 7,553,769 B2 * | 6/2009 | Toma | H01L 21/02063 | 257/E21.214 |
| 7,563,705 B2 * | 7/2009 | Tonegawa | H01L 21/32051 | 438/622 |
| 7,611,751 B2 * | 11/2009 | Elers | C23C 16/32 | 427/249.1 |
| 7,682,517 B2 * | 3/2010 | Nishimura | H01L 21/76814 | 216/39 |
| 7,687,910 B2 * | 3/2010 | Tsumura | H01L 21/76807 | 257/758 |
| 7,701,060 B2 * | 4/2010 | Tada | H01L 21/76802 | 257/751 |
| 7,723,237 B2 * | 5/2010 | Hyland | H01L 21/02063 | 257/E21.215 |
| 7,741,224 B2 * | 6/2010 | Jiang | H01L 21/3105 | 257/759 |
| 7,745,327 B2 * | 6/2010 | Preusse | H01L 21/76802 | 257/758 |
| 7,795,148 B2 * | 9/2010 | Brown | H01L 21/02063 | 216/13 |
| 7,838,428 B2 * | 11/2010 | Chen | H01L 21/3105 | 257/E23.145 |
| 7,842,518 B2 * | 11/2010 | Miyajima | H01L 21/02126 | 257/E21.001 |
| 7,851,360 B2 * | 12/2010 | Dominguez | C23C 16/18 | 257/E21.171 |
| 7,867,895 B2 * | 1/2011 | Yang | H01L 21/32134 | 257/E23.141 |
| 7,892,968 B2 * | 2/2011 | Chen | H01L 21/31144 | 438/637 |
| 7,928,004 B2 | 4/2011 | Seidel et al. | | |
| 7,968,451 B2 * | 6/2011 | Ko | H01L 21/76825 | 257/E23.168 |
| 7,973,409 B2 * | 7/2011 | Yang | H01L 21/7682 | 257/751 |

(56) References Cited

U.S. PATENT DOCUMENTS

| | | | | |
|---|---|---|---|---|
| 8,039,964 B2* | 10/2011 | Farooq | H01L 21/76807 | 257/758 |
| 8,058,153 B2* | 11/2011 | Asako | H01L 21/02063 | 257/E21.043 |
| 8,105,943 B2* | 1/2012 | Streck | H01L 21/76814 | 438/637 |
| 8,158,521 B2* | 4/2012 | Chang | H01L 21/02126 | 216/17 |
| 8,232,196 B2* | 7/2012 | Yang | H01L 21/76805 | 257/774 |
| 8,268,721 B2* | 9/2012 | Asako | H01L 21/3105 | 257/E21.495 |
| 8,278,763 B2* | 10/2012 | Tada | H01L 21/02126 | 257/760 |
| 8,357,610 B2* | 1/2013 | Feustel | H01L 21/76807 | 438/637 |
| 8,420,544 B2* | 4/2013 | Huang | H01L 21/76814 | 257/E21.226 |
| 8,445,382 B2* | 5/2013 | Besling | H01L 21/76808 | 257/632 |
| 8,492,266 B2* | 7/2013 | Ueki | H01L 21/02126 | 257/E23.145 |
| 8,574,445 B2* | 11/2013 | Cho | G03F 7/427 | 118/715 |
| 8,592,283 B2* | 11/2013 | Ito | H01L 21/02126 | 438/408 |
| 8,592,327 B2* | 11/2013 | Ranjan | H01L 21/02063 | 438/618 |
| 8,617,985 B2* | 12/2013 | Collins | H01L 21/76864 | 257/E21.021 |
| 8,647,535 B2* | 2/2014 | Malone | H01B 1/02 | 252/512 |
| 8,759,212 B2* | 6/2014 | Kume | H01L 21/02126 | 438/623 |
| 8,765,597 B2* | 7/2014 | Farooq | H01L 21/76807 | 438/628 |
| 8,859,430 B2* | 10/2014 | Chiba | H01L 21/02118 | 257/686 |
| 9,029,171 B2* | 5/2015 | Huang | H01L 21/02126 | 257/632 |
| 9,384,980 B2* | 7/2016 | Yoshimizu | H01L 21/0338 | |
| 2001/0005635 A1* | 6/2001 | Kitagawa | H01L 21/31138 | 438/710 |
| 2001/0051420 A1* | 12/2001 | Besser | H01L 21/76802 | 438/597 |
| 2003/0054656 A1* | 3/2003 | Soda | G03F 7/427 | 438/710 |
| 2004/0029386 A1* | 2/2004 | Lee | H01L 21/76808 | 438/689 |
| 2004/0150075 A1* | 8/2004 | Kaji | H01L 21/0212 | 257/632 |
| 2005/0106762 A1* | 5/2005 | Chakrapani | H01L 21/31058 | 438/4 |
| 2005/0127515 A1* | 6/2005 | Knorr | H01L 21/76831 | 257/762 |
| 2005/0151266 A1* | 7/2005 | Yoshizawa | H01L 21/76808 | 257/774 |
| 2005/0170269 A1 | 8/2005 | Nakagawa et al. | | |
| 2006/0003577 A1* | 1/2006 | Sone | H01L 21/76802 | 438/638 |
| 2006/0019485 A1* | 1/2006 | Komai | H01L 21/76811 | 438/627 |
| 2006/0099802 A1* | 5/2006 | Lin | H01L 21/76814 | 438/637 |
| 2006/0151887 A1* | 7/2006 | Oh | H01L 21/76808 | 257/774 |
| 2006/0240187 A1* | 10/2006 | Weidman | C23C 16/0272 | 427/248.1 |
| 2007/0037374 A1* | 2/2007 | Hayashi | H01L 21/0273 | 438/597 |
| 2007/0082488 A1 | 4/2007 | Katou | | |
| 2008/0054467 A1* | 3/2008 | Ohba | H01L 21/76826 | 257/751 |
| 2008/0179747 A1* | 7/2008 | Sakai | H01L 21/76805 | 257/751 |
| 2009/0017563 A1* | 1/2009 | Jiang | H01L 21/3105 | 438/4 |
| 2009/0085173 A1* | 4/2009 | Boemmels | H01L 21/76814 | 257/635 |
| 2009/0104774 A1* | 4/2009 | Furukawa | H01L 21/02126 | 438/680 |
| 2009/0134521 A1 | 5/2009 | Liu et al. | | |
| 2009/0283910 A1 | 11/2009 | Hinomura | | |
| 2010/0304566 A1* | 12/2010 | Fischer | H01L 21/3105 | 438/674 |
| 2011/0049718 A1* | 3/2011 | Matsumoto | C23C 16/40 | 257/751 |
| 2011/0256715 A1* | 10/2011 | Pan | H01L 21/76831 | 438/653 |
| 2013/0001710 A1 | 1/2013 | Daneman et al. | | |
| 2013/0277853 A1* | 10/2013 | Yang | H01L 23/53238 | 257/774 |
| 2014/0145332 A1* | 5/2014 | Ryan | H01L 23/53238 | 257/751 |

* cited by examiner

SEMICONDUCTOR DEVICES EMPLOYING A BARRIER LAYER

PRIORITY

This application is a divisional of U.S. patent application Ser. No. 13/734,892, filed on Jan. 4, 2013, and entitled, "Semiconductor Devices and Methods of Manufacture Thereof," which application is incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line.

The semiconductor industry continues to improve the integration density of various electronic components, e.g., transistors, diodes, resistors, capacitors, conductive lines, vias, etc. of integrated circuits by continual reductions in minimum feature size, which allow more components to be integrated into a given area. Some recent reduced feature size conductive line and via designs utilize low dielectric constant (k) insulating materials having a dielectric constant less than a dielectric constant of silicon dioxide for insulating materials, and copper or copper alloys for conductive material. These material systems can present manufacturing challenges in some applications. As an example, copper tends to diffuse into some low k insulating materials, so that the use of barrier layers in the conductive line and via structures is required.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of some of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Figure 1:
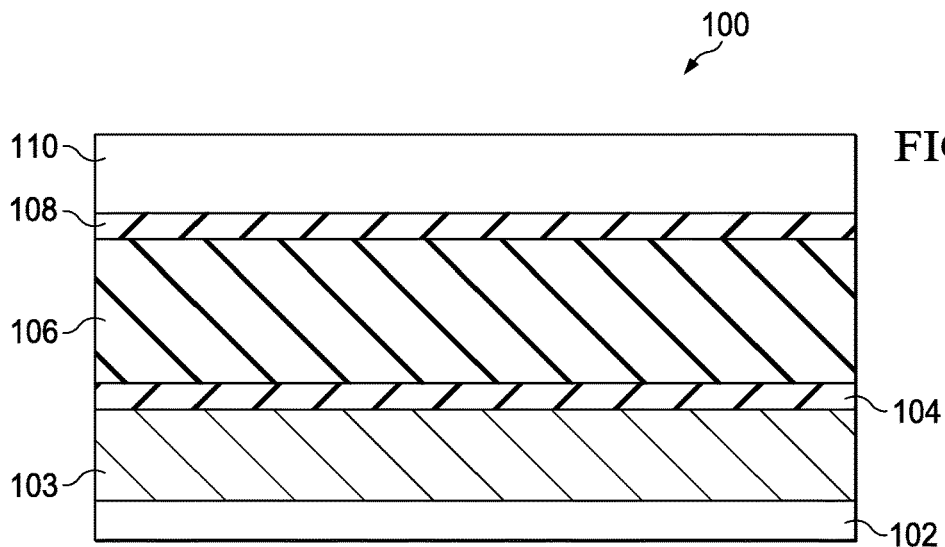
FIGS. 1 through 8 are cross-sectional views of a semiconductor device at various stages of manufacturing in accordance with some embodiments of the present disclosure.

FIGS. 1 through 8 are cross-sectional views illustrating a semiconductor device at various stages of manufacturing in accordance with some embodiments of the present disclosure. Referring first to FIG. 1, there is shown a semiconductor device 100 that includes a workpiece 102. The workpiece 102 may include a semiconductor substrate comprising silicon or other semiconductor materials and may be covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) or a germanium-on-insulator (GOI) substrate, as examples.

A conductive material 103 is formed over the workpiece 102. The conductive material 103 comprises Cu, a Cu alloy, other metals, or combinations thereof. Alternatively, the conductive material 103 may comprise other materials. The conductive material 103 is patterned into desired conductive features (not shown), such as conductive lines or traces, resistors, capacitor plates, or inductors, as examples. Alternatively, the conductive material 103 may be patterned with other features. The conductive material 103 may be formed using subtractive techniques, by depositing the conductive material 103 over the workpiece 102 and patterning the conductive material 103 using lithography. An insulating material (not shown) is then formed between the conductive features of the conductive material 103. Alternatively, the conductive material 103 may be formed using a damascene technique, by forming an insulating material over the workpiece 102, patterning the insulating material, and filling the patterned insulating material with the conductive material 103. Alternatively, the conductive material 103 may be formed using other methods. The conductive material 103 comprises a thickness of about 10 to 10,000 nm in some embodiments. Alternatively, the conductive material 103 may comprise other dimensions.

An etch stop layer (ESL) 104 is formed over the conductive material 103 in some embodiments. The ESL 104 comprises SiN, SiC, tetraethyl orthosilicate (TEOS), other insulating materials, or combinations thereof. Alternatively, the ESL 104 may comprise other materials. The ESL 104 comprises a thickness of about 1 nm to 1,000 nm in some embodiments. Alternatively, the ESL 104 may comprise other dimensions. The ESL 104 is not included in some embodiments. The ESL 104 may alternatively or may also comprise an adhesion layer, for example.

An insulating material layer 106 is formed over the ESL 104, or over the conductive material 103 if the ESL 104 is not included. The insulating material layer 106 comprises a low dielectric constant (k) insulating material in some embodiments having a dielectric constant or k value lower than the k value of silicon dioxide, which is about 3.9. In some embodiments, the insulating material layer 106 comprises an extra-low dielectric constant (ELK) material having a dielectric constant of less than about 2.5, as another example. The insulating material layer 106 comprises a material such as boron-doped silicon glass (BSG), phosphosilicate glass (PSG), fluorinated silicate glass (FSG), black diamond™ available from Applied Materials, or other materials having a dielectric constant that is lower than a dielectric constant of $SiO_2$, as examples, although alternatively, the insulating material layer 106 may comprise other materials. The insulating material layer 106 comprises a thickness of about 10 nm to 1,000,000 nm in some embodiments. Alternatively, the insulating material layer 106 may comprise other dimensions.

An ESL and/or hard mask 108 is formed over the insulating material layer 106 in some embodiments. The ESL and/or hard mask 108 comprises similar materials and dimensions as described for ESL 104, for example. The ESL and/or hard mask 108 is not included in some embodiments. The ESL and/or hard mask 108 may alternatively or may also comprise an adhesion layer, for example.

A photosensitive material 110 is formed over the ESL and/or hard mask 108, or over the insulating material layer 106 if the ESL and/or hard mask 108 is not included. The photosensitive material 110 comprises a photoresist or other photosensitive material. The photosensitive material 110 comprises a thickness of about 10 nm to 1,000,000 nm in some embodiments. Alternatively, the photosensitive material 110 may comprise other dimensions.

Figure 2:
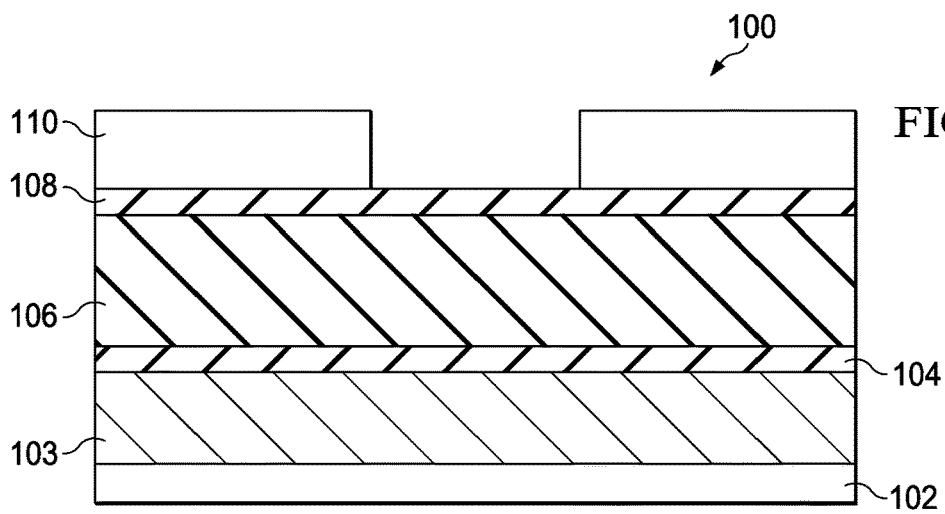

The photosensitive material 110 is patterned, as shown in FIG. 2. The photosensitive material 110 may be patterned using lithography, by exposing the photosensitive material 110 to light or energy reflected from or transmitted through a lithography mask having the desired pattern formed thereon. The photosensitive material 110 is developed, and exposed or unexposed portions (depending on whether the photosensitive material 110 comprises a positive or negative photoresist, for example) are ashed or etched away, forming the patterns in the photosensitive material 110 shown in FIG. 2. Alternatively, the photosensitive material 110 may be patterned using a direct patterning method, for example. The patterns in the photosensitive material 110 comprise a desired width for vias (not shown in FIG. 2; see via 140 in FIG. 8) that will be formed in the insulating material layer 106 in some embodiments.

Figure 3:
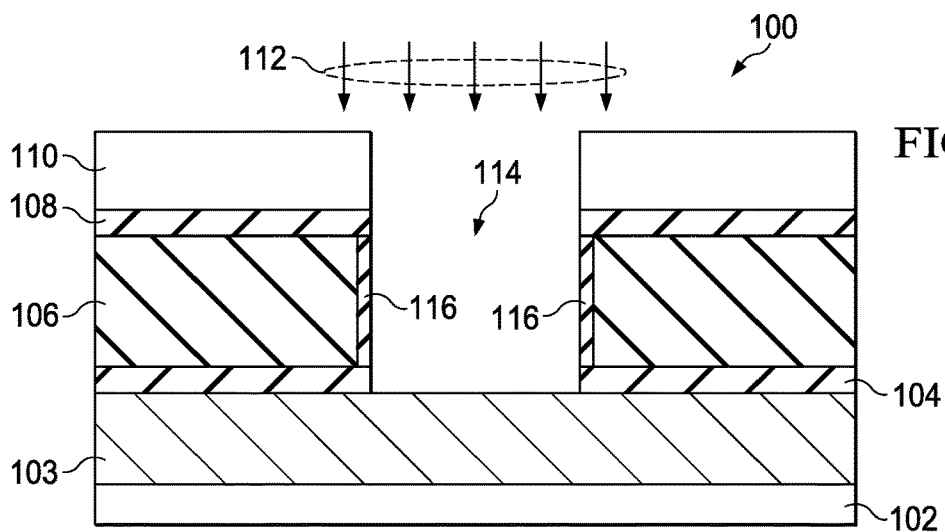

An etch process 112 is used to transfer the pattern of the photosensitive material 110 to the underlying insulating material layer 106 and the ESLs 104 and ESL and/or hard mask 108, if included in the structure, forming a trench 114, as shown in FIG. 3. The photosensitive material 110 is used as an etch mask during the etch process 112 for at least the insulating material layer 106, for example. A portion of the top surface of the conductive material 103 is exposed at the bottom of the trench 114. Only one trench 114 is shown in the drawings; however, a plurality of trenches 114 may be formed across the surface of the workpiece 102, depending on the design of the semiconductor device 100.

The etch process 112 comprises a dry etch process in some embodiments. Alternatively, the etch process 112 may comprise other types of etch processes. The etch process 112 forms damaged regions 116 on sidewalls of the trench 114 in some embodiments. In other embodiments, the damaged regions 116 are not formed by the etch process 112, but rather, by the removal later of the photosensitive material 110. In yet other embodiments, the damaged regions 116 are formed by both the etch process 112 of the insulating material layer 106 and also the removal of the photosensitive material 110.

Figure 4:
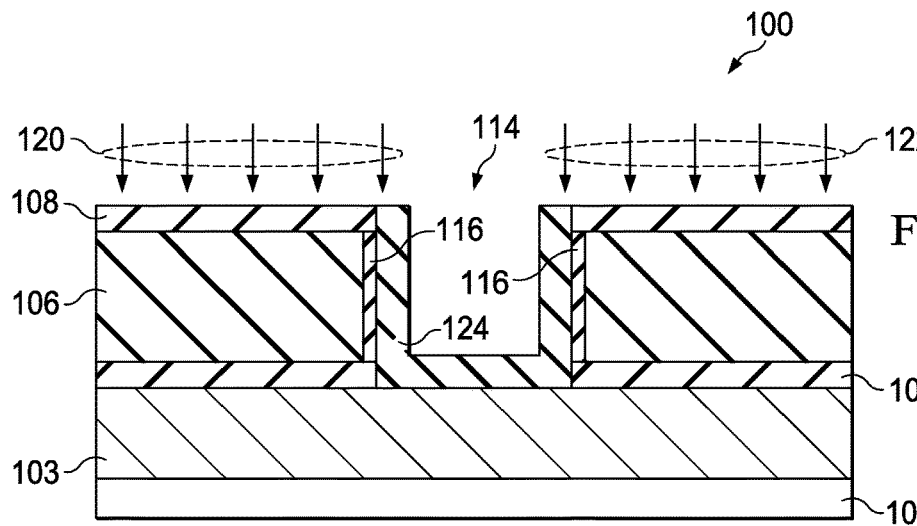

Next, in FIG. 4, the photosensitive material 110 is removed, leaving behind a residue 124 that lines the sidewalls and the bottom surface of the trench 114. The residue 124 comprises a polymer and/or other debris or materials, as examples. The photosensitive material 110 may be removed using an etch process and/or an ash process, as examples. The sidewalls of the trench 114 may be damaged during the removal of the photosensitive material 110, forming the damaged regions 116. Additional damage may be caused to the damaged regions 116 during the removal of the photosensitive material 110, if the damaged regions 116 were formed when the trenches 114 were formed, as another example.

The damaged regions 116 comprise a hydrophilic material in some embodiments. The damaged regions 116 comprise a low k (LK) material such as BSG, PSG, FSG, black diamond™, and other materials having a dielectric constant lower than a dielectric constant of $SiO_2$, as examples, although alternatively, the damaged region 116 may comprise other materials.

Next, a post etch residue removal (PERR) process 120 and a surface modification process 122 are performed on the semiconductor device 100, as shown in FIG. 4. The surface modification process 122 comprises introducing a surface modification compound comprising a hydrocarbon in some embodiments, for example. In some embodiments, the surface modification process 122 is performed in-situ, e.g., simultaneously, with the PERR process 120. A chemical such as a hydrocarbon can be added to the PERR process 120 to achieve the surface modification process 122, for example. In other embodiments, the surface modification process 122 is performed in a separate step, after the PERR process 120. In yet other embodiments, the surface modification process 122 is performed in a separate step, before the PERR process 120. The surface modification process 122 comprises introducing a surface modification compound that is adapted to modify the hydrophilic damaged regions 116 shown in FIG. 4 to form hydrophobic damaged regions 126 shown in FIG. 5, and to subsequently form a barrier layer 130 on the sidewalls of the trench 114 after a surface treatment process 128, as shown in FIG. 6.

Figure 5:
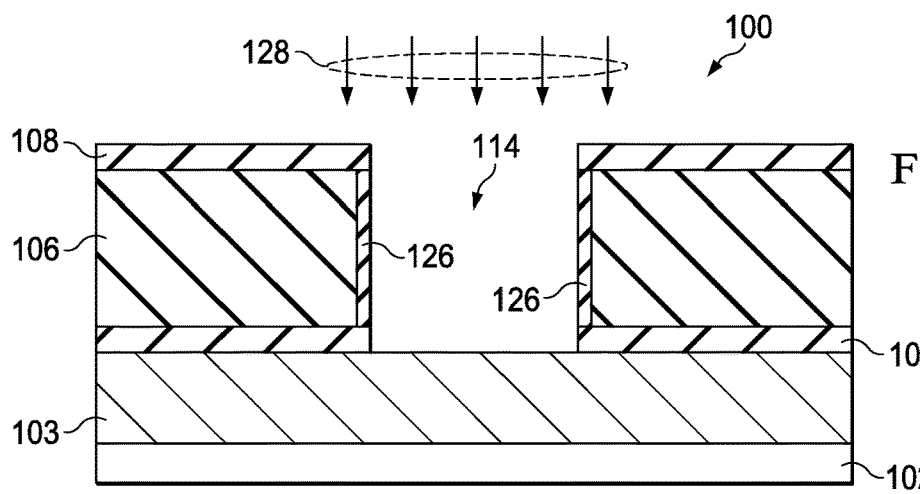
Figure 6:
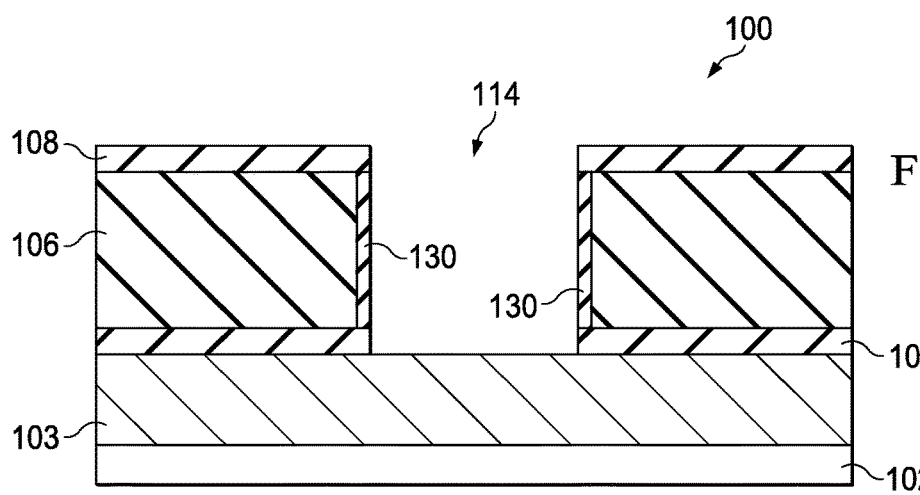

The PERR process 120 removes the residue 124 from over the top surface of the conductive material 103 and the damaged regions 116, as shown in FIG. 5. The surface modification process 122 converts the damaged regions 116 comprising a hydrophilic material shown in FIG. 4 to the damaged regions 126 comprising a hydrophobic material shown in FIG. 5.

A surface treatment process 128 is then performed on the semiconductor device 100, also shown in FIG. 5. The surface treatment process 128 comprises introducing a surface treatment compound comprising a hydrocarbon, a halocarbon, sulfured carbon, and/or silicon carbon, in some embodiments. In some embodiments, the surface treatment compound comprises an organic compound or an inorganic compound, as other examples. The surface treatment process comprises 128 heating, catalyzation, electrolization, photoirradiation, a method of forming composite materials, and/or combinations thereof in other embodiments, as examples. After surface treatment process 128, the surface formed on the trench sidewalls (e.g., the barrier layer 130) comprises a surface treatment product comprising hydrocarbon, halocarbon, sulfured carbon, silicon carbon, graphite, graphene, amorphous carbon, fullerene, and/or combinations thereof in other embodiments, as examples. The surface treatment process 128 comprises a graphization process, a carbonization process, a graphenization process, and/or combinations thereof, in other embodiments. Alternatively, the surface modification compound of the surface treatment process 122 and the surface treatment product of the surface treatment process 128 comprising the barrier layer 130 may comprise other chemicals or materials.

The barrier layer 130 includes the material used in the surface treatment process 128 and the damaged region 126 material. Advantageously, the barrier layer 130 is selectively formed on the sidewalls of the insulating material layer 106. For example, the barrier layer 130 is not formed on the top surface of the conductive material 103 at the bottom of the trench 113, as shown in FIG. 6. The barrier layer 130 is advantageously formed by altering the damaged regions 116/126 on the sidewalls of the trench 114. The barrier layer 130 comprises cobalt, ruthenium, tantalum, tantalum nitride, indium oxide, tungsten nitride, titanium nitride, and/or combinations thereof, as examples, although alternatively, the barrier layer 130 may comprise other materials.

Figure 7:
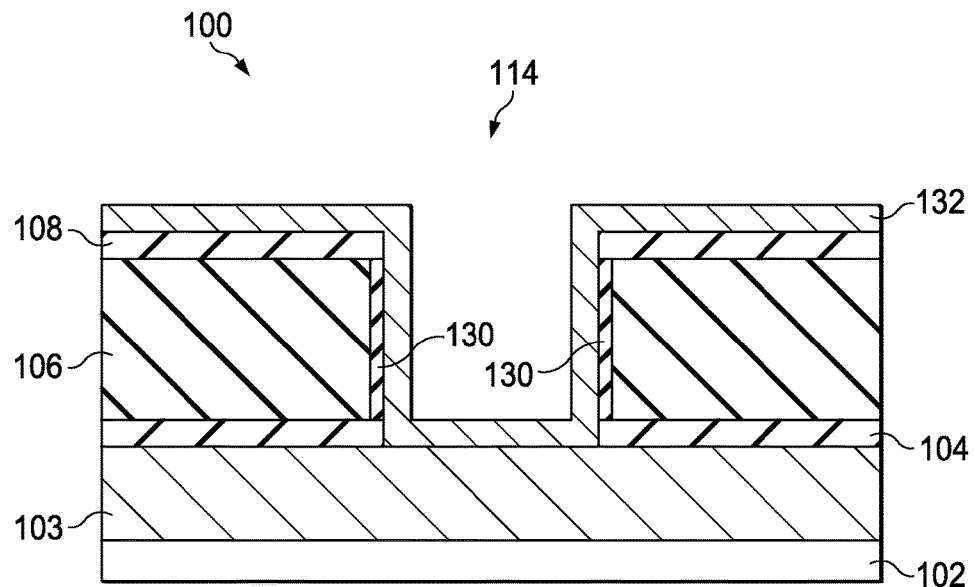
Figure 8:
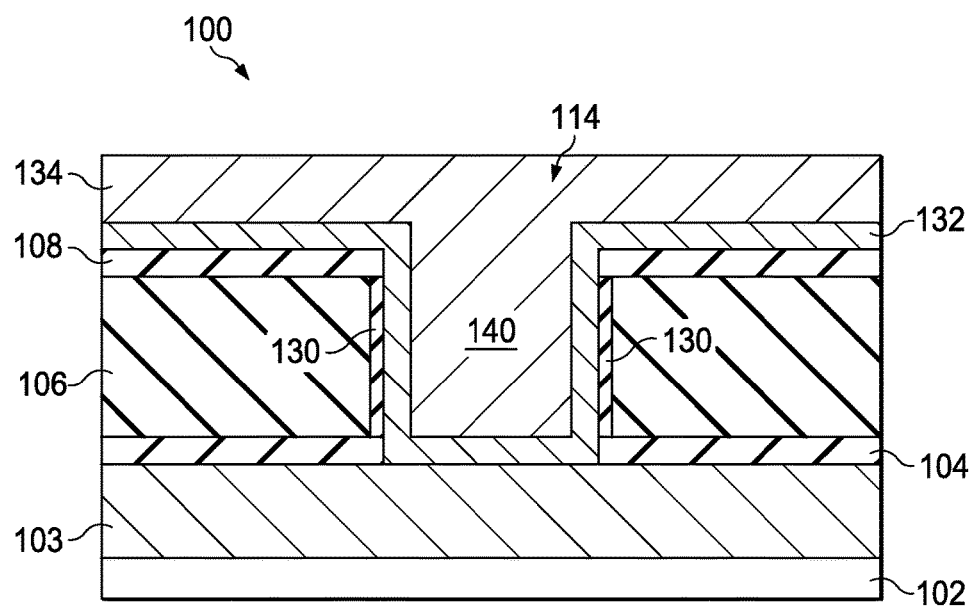

The manufacturing process for the semiconductor device 100 is then continued to form a via 140 in the trench 140, as shown in FIGS. 7 and 8. A seed layer 132 is formed over the insulating material layer 106 (e.g., over the ESL and/or hard mask 108 over the insulating material layer 106), over the barrier layer 130, and over the top surface of the conductive material 103 at the bottom of the trench 114, as shown in FIG. 7. The seed layer 132 comprises a conductive material such as Cu, a Cu alloy, or other conductive materials, as examples. A conductive material 134 is formed over the seed layer 132, filling the trench 114, as shown in FIG. 8. The conductive material 134 comprises Cu, a Cu alloy, or other conductive materials, as examples. The conductive material 134 is plated on using an electrochemical plating (ECP) process in some embodiments, as an example. The conductive material 134 may alternatively be formed using other methods. Conductive material 103 is also referred to herein as a first conductive material, and conductive material 134 is also referred to herein as a second conductive material, e.g., in some of the claims.

The seed layer 132 and conductive material 134 disposed within the trench 114 form a via 140. The via 140 comprises a conductive plug of material that is disposed between and electrically connects conductive material 103 to conductive material 134. The via 140 comprises a round, oval, square, rectangular, or other shapes in a top view of the workpiece 102, as examples.

Conductive material 134 may be patterned in some embodiments to form conductive lines or traces, resistors, capacitor plates, or inductors, as examples. The conductive material 134 may alternatively be patterned into other shapes. Conductive material 134 may later be patterned using a subtractive etch. Alternatively, conductive material 134 may be formed using a damascene process, as described for conductive material 103. Conductive material 134 may also be formed using a dual damascene process, wherein the vias 140 and conductive lines in the conductive material 134 disposed over the top surface of the insulating material layer 106 are simultaneously formed, as another example.

Figure 9:
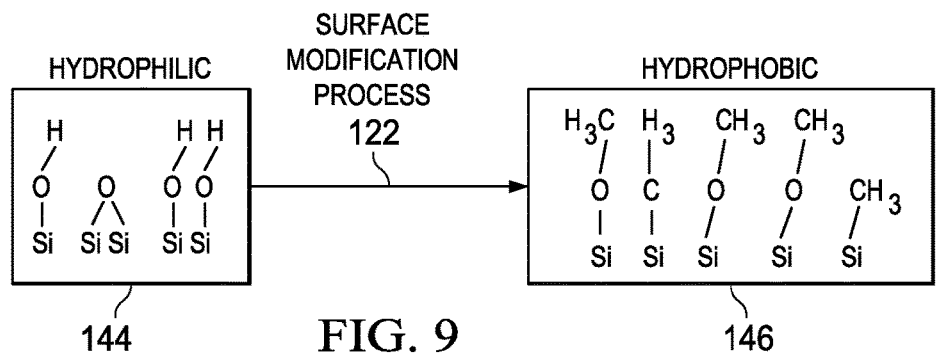
FIG. 9 is a diagram showing a chemical change of a damaged region of sidewalls of a trench in an insulating material layer after a surface modification process in accordance with an embodiment.

FIG. 9 is a diagram showing a chemical reaction (e.g., alkylation) of a damaged region 116 of a trench 114 sidewall of an insulating material layer 106 after a surface modification process 122 in accordance with an embodiment. By changing the functional group of the molecules, expected suitable materials can be synthesized in accordance with embodiments. The molecular structure of a hydrophilic damaged region 116 (see FIG. 4) comprising a LK material, such as BSG, PSG, FSG, black diamond™, an ELK material, and other materials having a dielectric constant that is lower than a dielectric constant of $SiO_2$, is shown at 144. The molecular structure of a hydrophobic damaged region 126 (see FIG. 5) after the surface modification process 122 is shown at 146. Water molecules absorb less strongly on the non-polar —CH groups of the hydrophobic damaged region 126 material than on the polar —OH groups of the hydrophilic damaged region 116. The impact of the surface modification process 122 on the molecular structure of the damaged regions 116 to form damaged regions 126 advantageously facilitates in the formation of the selectively formed barrier layer 130 on the sidewalls of the trench 114 during the subsequent surface treatment process 128.

Figure 10:
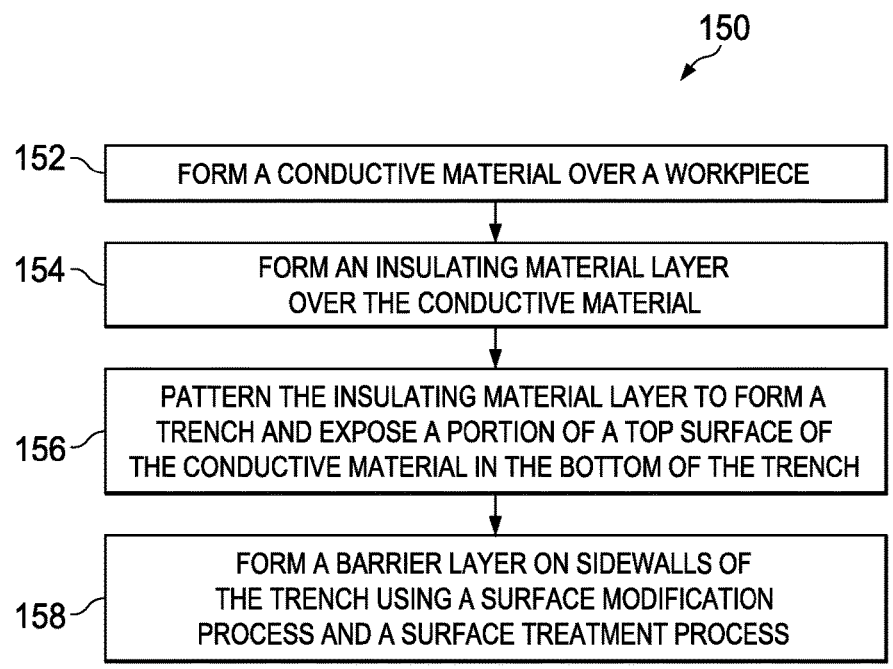
FIG. 10 is a flow chart illustrating a method of manufacturing a semiconductor device in accordance with some embodiments.

FIG. 10 is a flow chart 150 illustrating a method of manufacturing a semiconductor device 100 in accordance with some embodiments. In step 152, a conductive material 103 is formed over a workpiece 102. In step 154, an insulating material layer 106 is formed over the conductive material 103. In step 156, the insulating material layer 106 is patterned to form a trench 114 and expose a portion of a top surface of the conductive material 103 in the bottom of the trench 114. In step 158, a barrier layer 130 is formed on sidewalls of the trench 114 using a surface modification process 122 and a surface treatment process 128.

Some embodiments of the present disclosure include methods of manufacturing the semiconductor devices 100 that include forming the barrier layers 130. Other embodiments include semiconductor devices 100 that include the novel barrier layers 130 described herein.

Advantages of some embodiments of the disclosure include providing manufacturing methods for semiconductor devices 100 wherein novel barrier layers 130 are formed on sidewalls of trenches 114 within insulating material layers 106. The barrier layers 130 are selectively formed on the sidewalls of the trenches 114. The barrier layers 130 are not formed on the top surface of the conductive material 103 disposed beneath the insulating material layers 106, avoiding damage to or a deleterious impact on the conductivity, resistance, and electrical properties of the conductive material 103. Furthermore, because the barrier layers 130 are not formed on the surface of the conductive material 103, there is no concern for further conductive material 103 loss during a subsequent sputtering seed layer 132 step used to remove undesired barrier layers over the conductive material 103.

The barrier layer 130 advantageously recovers the damaged insulating material layer 106, making use of the damaged regions 116 and 126 of the insulating material layer 106 rather than needing to repair the damaged regions 116 or experience poor device 100 performance. A baking step to remove moisture from the insulating material layer 106 and a purge step for a gas such as $N_2$ to prevent moisture diffusion in the insulating material layer 106 can be eliminated in the process flow in some applications by the use of the novel barrier layers 130, as examples. The formation of a conformal barrier layer over the trench 114 comprising a material such as TaN to prevent diffusion of metal into the insulating material layer 106 can also be eliminated in some applications from the process flow by the use of the novel barrier layers 130 described herein, as another example. The barrier layer 130 also functions as an adhesion layer for the subsequently deposited seed layer 132 in some embodiments. The novel manufacturing methods, barrier layers 130 and via 140 structures and designs are easily implementable in manufacturing process flows.

The barrier layers 130 described herein include hydrocarbon materials such as graphite, which are excellent barrier materials having a lattice constant of about 2.462, as an example. As another example, graphene is very dense and impenetrable, preventing small molecules, even helium (He) from passing through. Thus, the barrier layers 130 described herein function as a strong protection layer against metal diffusion for the trench 114 sidewalls of the insulating material layer 106, advantageously.

Further advantages of the novel barrier layers 130 include a prolonged queue (Q) time, due to preventing the insulating material layer 106 from moisture absorption, resulting in a productivity improvement. After the damaged regions 116 are converted to hydrophobic damaged regions 126 using the surface modification process 122, the insulating material layer 106 can no longer absorb $H_2O$ molecules because the sidewalls of the trench 114 are covered by the hydrophobic damaged regions 126. The use of the selectively formed barrier layers 130 avoids the need to remove a conformally deposited barrier film from over the conductive material 103 top surface using chemical bombardment, which can cause conductive material 103 loss. Additionally, the novel selectively formed barrier layers 130 prevent a k value shift of the insulating material layer 106, leakage risks or problems, and RC shift.

In accordance with some embodiments of the present disclosure, a method of manufacturing a semiconductor device includes providing a workpiece including an insulating material layer disposed thereon. The insulating material layer includes a trench formed therein. The method includes forming a barrier layer on the sidewalls of the trench using a surface modification process and a surface treatment process.

In accordance with other embodiments, a method of manufacturing a semiconductor device includes forming a conductive material over a workpiece, forming an insulating material layer over the conductive material, and patterning the insulating material layer to form a trench and expose a portion of a top surface of the conductive material in the bottom of the trench. A barrier layer is formed on sidewalls of the trench using a surface modification process and a surface treatment process.

In accordance with other embodiments, a semiconductor device includes a workpiece, a conductive feature formed over the workpiece, and an insulating material layer disposed over the conductive feature. A via is coupled to the conductive feature, the via being disposed in the insulating material. A barrier layer disposed on sidewalls of the via proximate the insulating material layer. The barrier layer comprises a material selected from the group consisting essentially of hydrocarbon, halocarbon, sulfured carbon, silicon carbon, graphite, graphene, amorphous carbon, fullerene, and combinations thereof.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
   a conductive feature formed over a workpiece, the workpiece comprising a semiconductor substrate;
   a first etch stop layer formed over the conductive feature;
   an insulating material layer disposed over the first etch stop layer;
   a second etch stop layer formed over the insulating material layer;
   a via comprising a metal coupled to the conductive feature, the via extending through the first etch stop layer, the insulating material layer, and the second etch stop layer; and
   a barrier layer disposed on sidewalls of the via only between the first etch stop layer and the second etch stop layer, wherein sidewalls of the first etch stop layer are co-planar with sidewalls of the second etch stop layer, wherein the barrier layer directly underlies the second etch stop layer, wherein the barrier layer directly contacts a Cu or a Cu alloy material, wherein the barrier layer is directly interposed between the insulating material layer and the via, and wherein the barrier layer prevents diffusion of the metal into the insulating material layer.

2. The semiconductor device according to claim 1, wherein the insulating material layer comprises boron-doped silicon glass (BSG), phosphosilicate glass (PSG), or fluorinated silicate glass (FSG).

3. The semiconductor device according to claim 1, wherein the conductive feature comprises Cu or a Cu alloy.

4. The semiconductor device according to claim 1, wherein the Cu or the Cu alloy material is a seed layer of the via formed on the barrier layer, and wherein the via further comprises a conductive material over the seed layer.

5. The semiconductor device according to claim 1, wherein the barrier layer comprises a portion of the insulating material layer that has reacted to a material selected from the group consisting of hydrocarbon, halocarbon, sulfured carbon, silicon carbon and amorphous carbon.

6. The semiconductor device according to claim 1, wherein the conductive feature is free of the barrier layer.

7. The semiconductor device of claim 1, wherein each sidewall of the barrier layer is aligned with a sidewall of the first etch stop layer and a sidewall of the second etch stop layer.

8. The semiconductor device according to claim 1, further comprising a surface treatment product bonded to the barrier layer.

9. The semiconductor device according to claim 8, wherein the surface treatment product comprises cobalt, ruthenium, tantalum, tantalum nitride, indium oxide, tungsten nitride, titanium nitride, or a combination thereof.

10. A semiconductor device comprising:
    an interconnect line formed over a semiconductor substrate;
    a first etch stop layer formed over at least part of the interconnect line;
    a material formed over the first etch stop layer and having a trench therein, the trench including sidewalls, the material including an insulating bulk region and a converted region, the converted region lining the sidewalls of the trench and forming a barrier layer, wherein the barrier layer comprises a material composition equal to a material composition of the insulating bulk region reacted with a material selected from the group consisting of hydrocarbon, halocarbon, sulfured carbon, silicon carbon, and amorphous carbon;

a conductive via comprising a metal formed within the trench and in electrical contact with the interconnect line, wherein a Cu or a Cu alloy material disposed within the trench physically contacts the interconnect line; and a second etch stop layer over and directly contacting the converted region, wherein a side surface of the second etch stop layer facing the trench is coplanar with a side surface of the first etch stop layer facing the trench.

11. The semiconductor device according to claim 10, wherein the material has a thickness from 10 nm to 1,000,000 nm.

12. The semiconductor device according to claim 10, wherein the material comprises boron-doped silicon glass (BSG), phosphosilicate glass (PSG), fluorinated silicate glass (FSG), SiCOH, and a combination thereof.

13. The semiconductor device according to claim 10, wherein the converted region is between the first etch stop layer and the second etch stop layer.

14. The semiconductor device according to claim 10, wherein the Cu or the Cu alloy material disposed within the trench and physically contacting the interconnect line is a seed layer of the conductive via, and wherein the seed layer is formed on at least the converted region.

15. The semiconductor device of claim 10, wherein each sidewall of the conductive via is straight from a top of the trench to a bottom of the trench.

16. A semiconductor device comprising:
an interconnect line formed over a semiconductor substrate;
a first etch stop layer over the interconnect line, the first etch stop layer having a top surface, the first etch stop layer having a side surface adjacent the top surface;
a second etch stop layer over the first etch stop layer, the second etch stop layer having a bottom surface, the second etch stop layer having a side surface adjacent the bottom surface, wherein the side surface of the second etch stop layer is coplanar with the side surface of the first etch stop layer;
a material layer between the top surface of the first etch stop layer and the bottom surface of the second etch stop layer, the material layer including a bulk region and a converted region, the converted region being in direct physical contact with the second etch stop layer;
a trench defined in the material layer and the second etch stop layer, wherein the converted region of the material layer lines sidewalls of the trench, wherein a material composition of the converted region is different than a material composition of the bulk region; and
a conductive via comprising a metal formed within the trench and in electrical contact with the interconnect line, wherein the converted region is in direct physical contact with a Cu or a Cu alloy material of the conductive via, wherein the Cu or the Cu alloy material of the conductive via is further in direct physical contact with the interconnect line;
wherein the second etch stop layer is in direct contact with the material layer.

17. The semiconductor device according to claim 16, wherein the material layer has a thickness from 10 nm to 1,000,000 nm.

18. The semiconductor device according to claim 16, wherein the converted region is a diffusion barrier layer.

19. The semiconductor device according to claim 18, wherein the interconnect line is free of the diffusion barrier layer.

20. The semiconductor device according to claim 16, wherein the material layer comprises boron-doped silicon glass (BSG), phosphosilicate glass (PSG), fluorinated silicate glass (FSG), SiCOH, and a combination thereof.

* * * * *